United States Patent
Dobyns (10) Patent No.: US 7,152,006 B2
(45) Date of Patent: Dec. 19, 2006

(54) MULTI-INSTRUMENT TRIGGERING

(75) Inventor: Kenneth P. Dobyns, Beaverton, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 10/987,868

(22) Filed: Nov. 12, 2004

(65) Prior Publication Data

US 2006/0106565 A1   May 18, 2006

(51) Int. Cl.
  *G06F 3/01* (2006.01)
(52) U.S. Cl. .................. 702/66; 702/65; 702/69; 702/188
(58) Field of Classification Search .............. 702/117, 702/118, 120, 182, 183, 188, 65, 66, 69; 370/360; 705/52; 709/225; 710/317
See application file for complete search history.

(56) References Cited

U.S. PATENT DOCUMENTS

| | | | |
|---|---|---|---|
| 5,604,735 A * | 2/1997 | Levinson et al. | 370/360 |
| 6,430,194 B1 * | 8/2002 | Ilyadis et al. | 370/462 |
| 6,754,763 B1 * | 6/2004 | Lin | 710/317 |

* cited by examiner

*Primary Examiner*—Marc S. Hoff
*Assistant Examiner*—Felix Suarez
(74) *Attorney, Agent, or Firm*—Francis I. Gray; Thomas F. Lenihan (57) ABSTRACT

A multi-instrument triggering system includes in each instrument trigger system a system ready line for coupling an internal ready signal to an external port. A multi-instrument trigger bus cable connects the external ports, trigger event outputs and trigger event inputs of multiple instruments together in such a way as to enable the trigger generators in the instruments when all instruments are ready to receive a trigger event. When enabled, a coordinated trigger is generated in response to an internal trigger event from at one of the instruments. The coordinated trigger is coupled via the multi-instrument trigger bus cable as the trigger event to trigger all instruments in synchronism.

12 Claims, 12 Drawing Sheets

MULTI-INSTRUMENT TRIGGERING

BACKGROUND OF THE INVENTION

The present invention relates to triggering in instruments, and more particularly to a multi-instrument triggering method for coordinating trigger events between instruments that prevents the instruments from drifting out of synchronization.

Many modern instruments, such as oscilloscopes, logic analyzers, spectrum analyzers, network analyzers, waveform monitors and the like, provide the ability to coordinate trigger events with other instruments. This traditionally is done by providing an output signal that corresponds to a trigger event within one instrument coupled to an auxiliary, or external, trigger input that is used to trigger another. A user cross-couples these signals, with one instrument's trigger output feeding another instrument's trigger input. This allows one instrument to trigger the other, coordinating their trigger events.

While this setup provides reasonable functionality in many situations, it has weaknesses that reduce its usefulness. One of these weaknesses is that the setup is really only suitable for single-shot trigger events. In the normal scenario two instruments, a master and a slave, are setup in single-shot mode. The slave instrument is put into a RUN state first. When it is ready to accept a trigger, the master instrument is manually started. When the master instrument triggers, the slave instrument is triggered as well. If the user wants to capture a second event, both instruments have to be manually restarted.

If the instruments are setup to provide continuous triggering, it is possible for the master instrument to trigger on a subsequent event before the slave instrument is ready to be triggered. The result is that the waveform shown on the master instrument display for the subsequent event does not have a correlated waveform on the slave instrument. This allows the two instruments to drift out of synchronization.

What is desired is a multi-instrument triggering mechanism that eliminates synchronization drift in order to allow more coordinated acquisitions between instruments.

BRIEF SUMMARY OF THE INVENTION

Accordingly the present invention provides a method of coordinating trigger events between instruments, such as oscilloscopes, that eliminates synchronization drift. An additional line is added to each instrument to provide a System Ready output. This line, when coupled to the corresponding line of other instruments, allows each instrument to indicate to the other instruments when all instruments are ready to accept a trigger. The System Ready line may be an open-drain-type signal that is pulled down by any instrument coupled to it to indicate that such instrument is not ready for triggering. Once every instrument has released the line, indicating that all instruments are ready to accept a trigger, the line is pulled high, allowing every instrument to trigger on a next trigger event.

The objects, advantages and other novel features of the present invention are apparent from the following detailed description when read in conjunction with the appended claims and attached drawing.

DETAILED DESCRIPTION OF THE INVENTION

Figure 1:
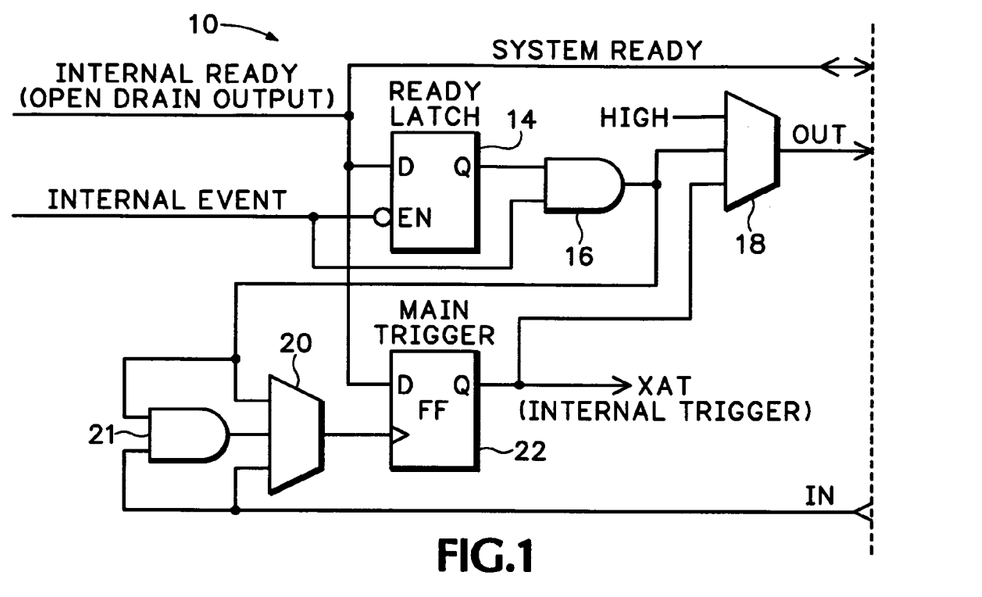
FIG. 1 is a simple schematic diagram view of a portion of a trigger system that allows multi-instrument triggering according to the present invention.

Referring now to FIG. 1 an instrument trigger circuit provides an internal ready signal, INT_RDY, when the instrument is ready to accept a trigger to acquire data. INT_RDY is provided at the input of a ready latch 14 and also is provided on a system ready line, SYS_RDY, coupled to an external port of the instrument. The system ready line indicates to other instruments that "I am ready to accept a trigger." An internal trigger event, INT_EVENT, generated from the trigger circuit is inverted and applied to an enable input, EN, of the ready latch 14, and also is input to a ready AND gate 16 which has a second input coupled to receive an output from the ready latch. A gated trigger event output from the ready AND gate 16 is applied to an event output multiplexer 18, to a trigger source multiplexer 20, and to a gated trigger AND gate 21. The output of the event output multiplexer 18 is coupled to a trigger event output port, OUT, of the instrument, and also has as inputs a logic HIGH signal and an internal trigger, XAT, output from a main trigger flip-flop 22. The output from the event output multiplexer 18 indicates to other instruments that "I have met my portion of the trigger criteria." An external trigger signal may be applied via a trigger event input port, IN, of the instrument. The event input port is coupled to the trigger source multiplexer 20, and to a second input of the gated trigger AND gate 21. The output of the gated trigger AND gate 21 is input to the trigger source multiplexer 20, and the output from the trigger source multiplexer is input to a clock input of the main trigger flip-flop 22. The input to the main trigger flip-flop 22 is the internal ready signal.

Generally in operation the trigger circuit generates the internal ready signal that may be combined with the internal ready signal from other instruments via the external port to form the SYS_RDY signal. When this line is high, it signifies that all instruments connected to the line are ready to accept a trigger. The SYS_RDY signal is latched by the ready latch 14 on the next falling edge of the internal event. This enables the ready AND gate 16, allowing a future internal event to pass through to the event output multiplexer 18, the trigger source multiplexer 20 and the gated trigger AND gate 21. Effectively the ready latch 14 uses the SYS_RDY signal to gate the internal events. The event output multiplexer 18 allows one of the following to be sent to other instruments via the event output port: a logic high; a gated internal event; or the internal trigger. The trigger source multiplexer 20 at the clock input of the main trigger flip-flop 22 allows one of the following to trigger the instrument: the gated internal event; an external trigger from another instrument; or the logical AND of the prior two signals.

Figure 2:
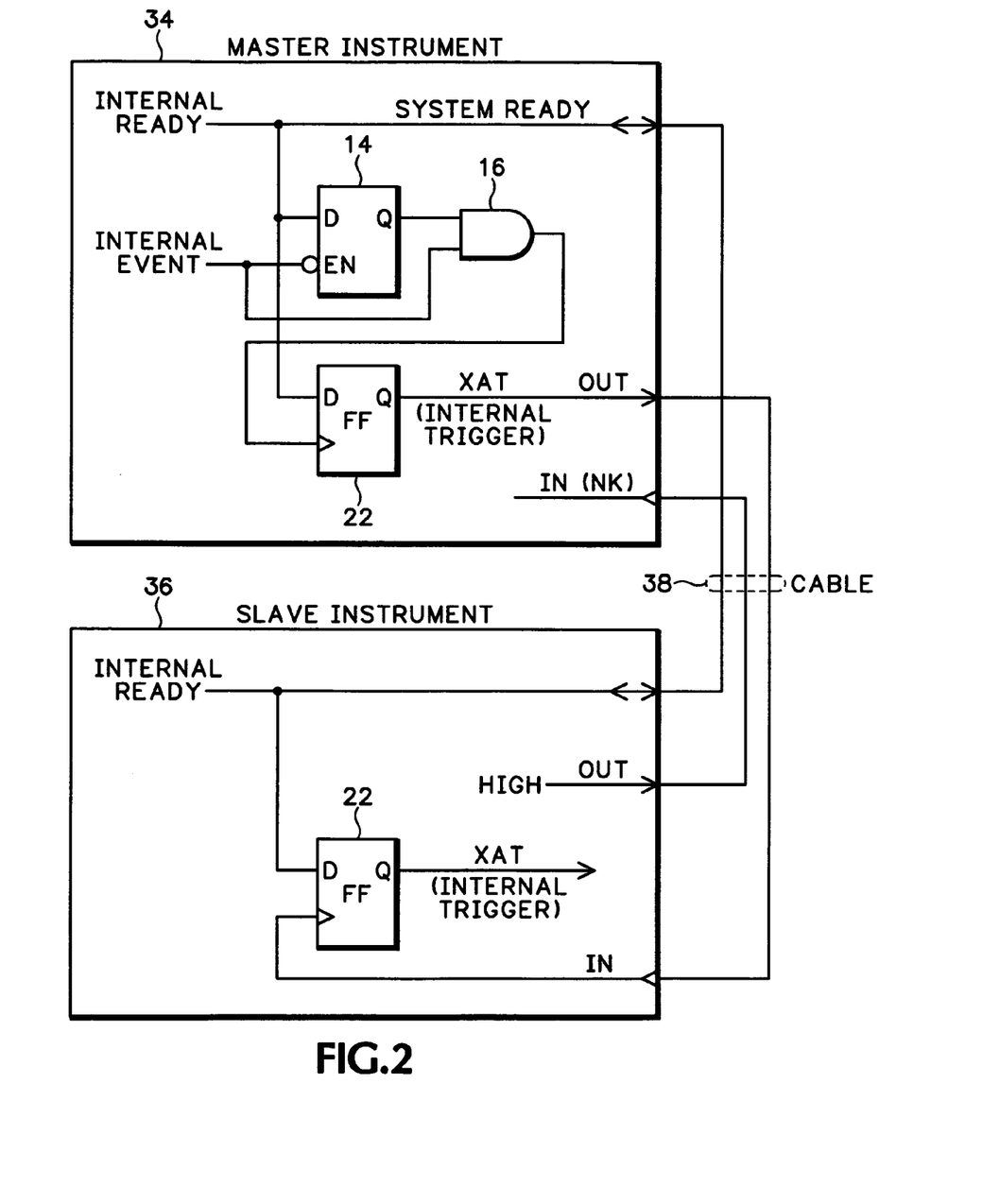
FIG. 2 is a simple schematic diagram view for coordinating trigger events between a master and a slave instrument according to the present invention.

FIG. 2 illustrates how two instruments may be interconnected to provide trigger event coordination. A master instrument 34 has its System Ready line tied to the System Ready line of a slave instrument 36, its event output tied to the event input of the slave instrument, and its event input tied to the event output of the slave instrument. The master instrument 34 is set up such that its event output is programmed to send an accepted trigger event. The event output multiplexer 18 passes the output from the main trigger flip-flop 22 to the event output, and the trigger source multiplexer 20 couples the gated event from the ready AND gate 16 to the clock input of the main trigger flip-flop. The slave instrument 36 has its event output multiplexer 18 tie the logic HIGH to the event output, and its trigger source multiplexer 20 tie the event input to the clock input of the main trigger flip-flop 22. For ease of understanding the operation of the master/slave configuration, the set-up is shown without the event output and trigger source multiplexers 18, 20.

Figure 3:
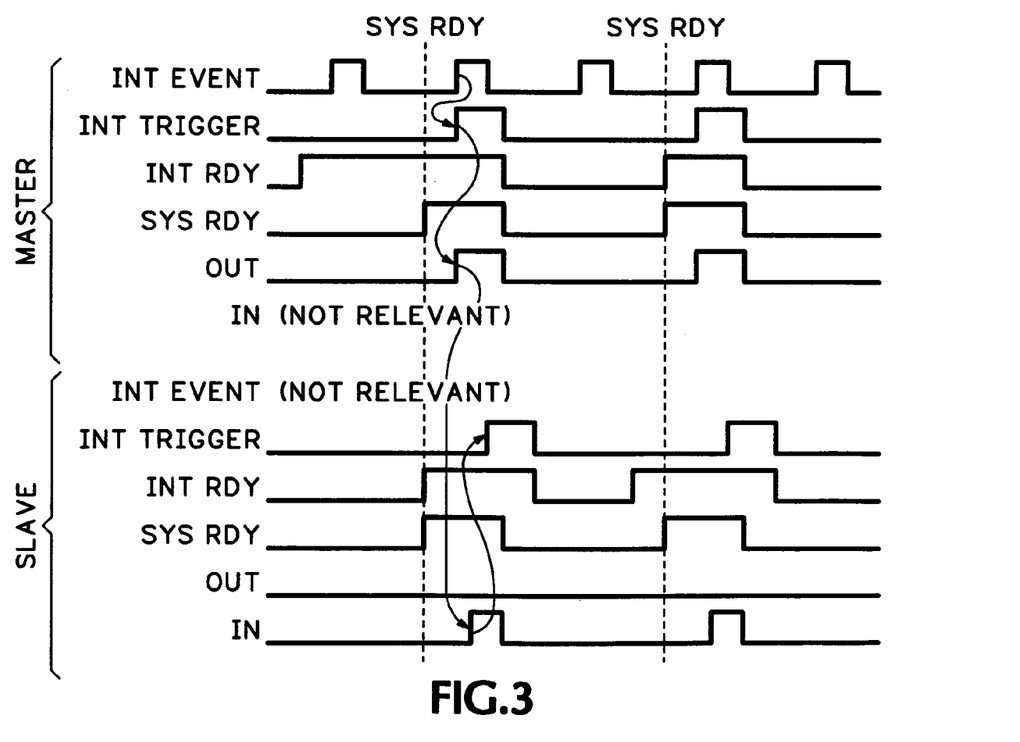
FIG. 3 is a timing diagram view for the configuration of FIG. 2 according to the present invention.

Referring now to the timing diagram of FIG. 3, when both instruments are ready to accept triggers, i.e., both internal ready signals are present, the SYS_RDY signal results as a logic HIGH, enabling both main trigger event flip-flops 22 and the master instrument ready latch 14. Following the arrows, when the master instrument 34 generates a next internal event, it produces the gated event which triggers the main trigger flip-flop 22 to generate the internal trigger for the master instrument which in turn triggers the main trigger flip-flop in the slave instrument 36 to generate the internal trigger for the slave instrument. The connections between the respective external output ports, event outputs and event inputs may be in the form of a multi-instrument trigger cable 38. The length of the multi-instrument trigger cable 38 introduces a time misalignment between the internal triggers in the two instruments 34, 36. The time misalignment may be removed with manual skew controls, as is well known in the art.

Therefore a new trigger setting may be defined—Trigger Control with choices of Internal, Slave, Master and Contributor. The Trigger Control determines the selection of the outputs for the event output and trigger source multiplexers 18, 20. The Trigger Control is set to Internal when the instrument is not connected to a multi-instrument trigger bus formed by the interconnection of the event outputs, event inputs and external output ports via the multi-instrument trigger cable 38, and the Master, Slave and Contributor choices are not available. The Internal state means that the instrument triggers using its own internal trigger setup and does not send any trigger signals over the multi-instrument trigger bus. The Slave state means that the instrument is triggered by an externally generated trigger event. The Contributor state means that the instrument is setup to send its gated internal events out on the multi-instrument trigger bus. These gated internal events are used externally to generate a global trigger event that is used to trigger all instruments. The Master state means that the instrument is setup to send its internal trigger out on the multi-instrument trigger bus for use as a global trigger event for the slave instrument(s).

Figure 4:
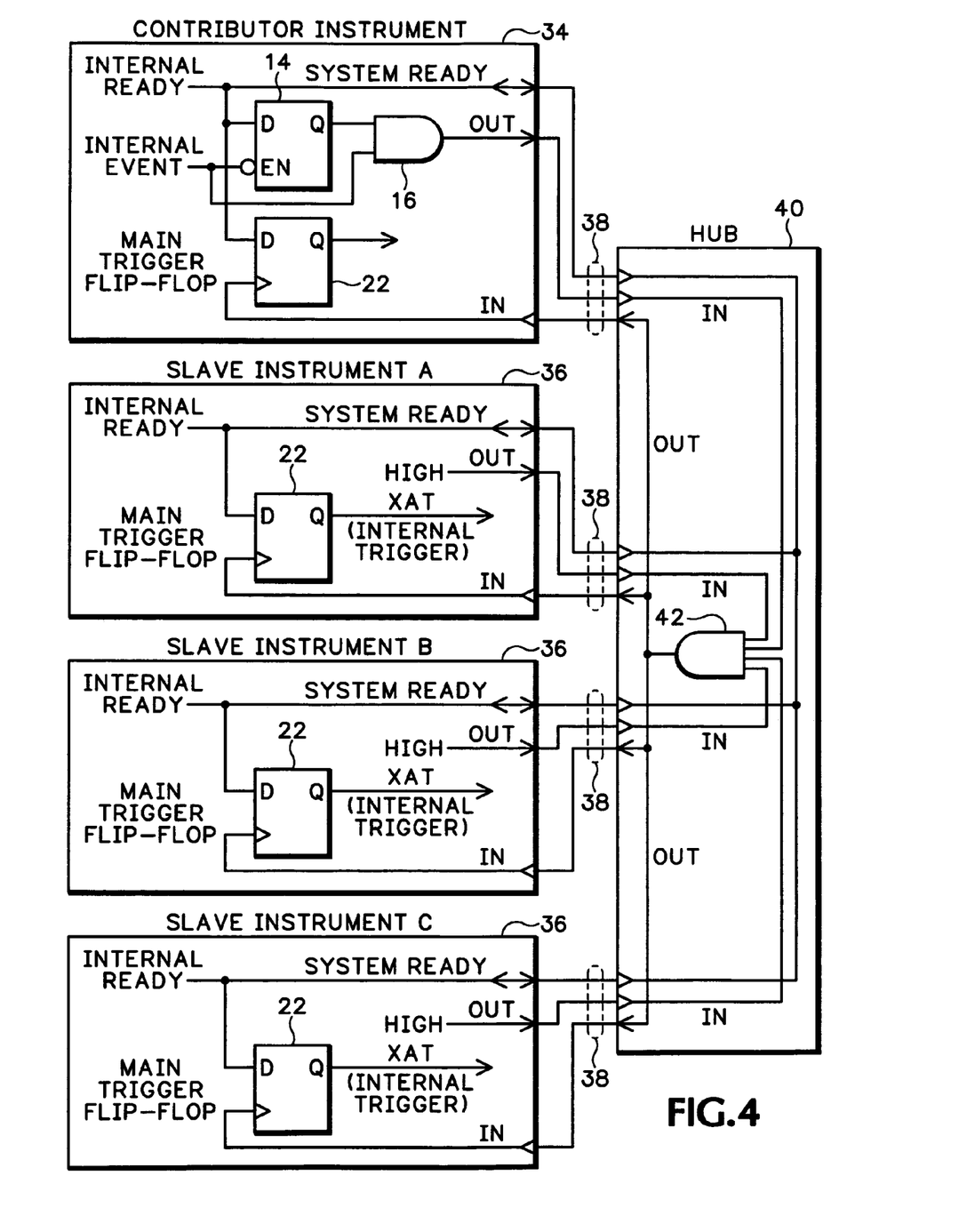
FIG. 4 is a simple schematic diagram view for coordinating trigger events between a master and multiple slave instruments according to the present invention.

For more than two instruments in a master/slave relationship, FIG. 4 shows the multi-instrument trigger bus 38 for each instrument 34, 36 being coupled to a distribution hub 40. The system ready lines are wire-OR'd together within the hub 40. The event outputs are all coupled to a trigger AND gate 42 in the hub 40. The output from the trigger AND gate 42 is coupled to the event inputs of the instruments 34, 36. The master instrument 34 is configured as a contributor. The slave instruments A, B, C 36 are configured as shown in FIG. 2. When all the instruments 34, 36 are ready to accept triggers, i.e., have the internal ready signal, the system ready line goes high, enabling all of the main trigger flip-flops 22 and the main instrument ready latch 14. When the contributor instrument 34 generates the next internal event, it is combined with the logic HIGH from all of the slave instruments 36 using the trigger AND gate 42 in the hub 40 to generate the coordinated trigger for all of the instruments. Generating the coordinated trigger signal in the hub 40 and using equal length multi-instrument trigger bus cables 38 minimizes time misalignment between the internal triggers within the instruments, with any residual time misalignment being removed with the manual skew controls, as is well known in the art.

Figure 5:
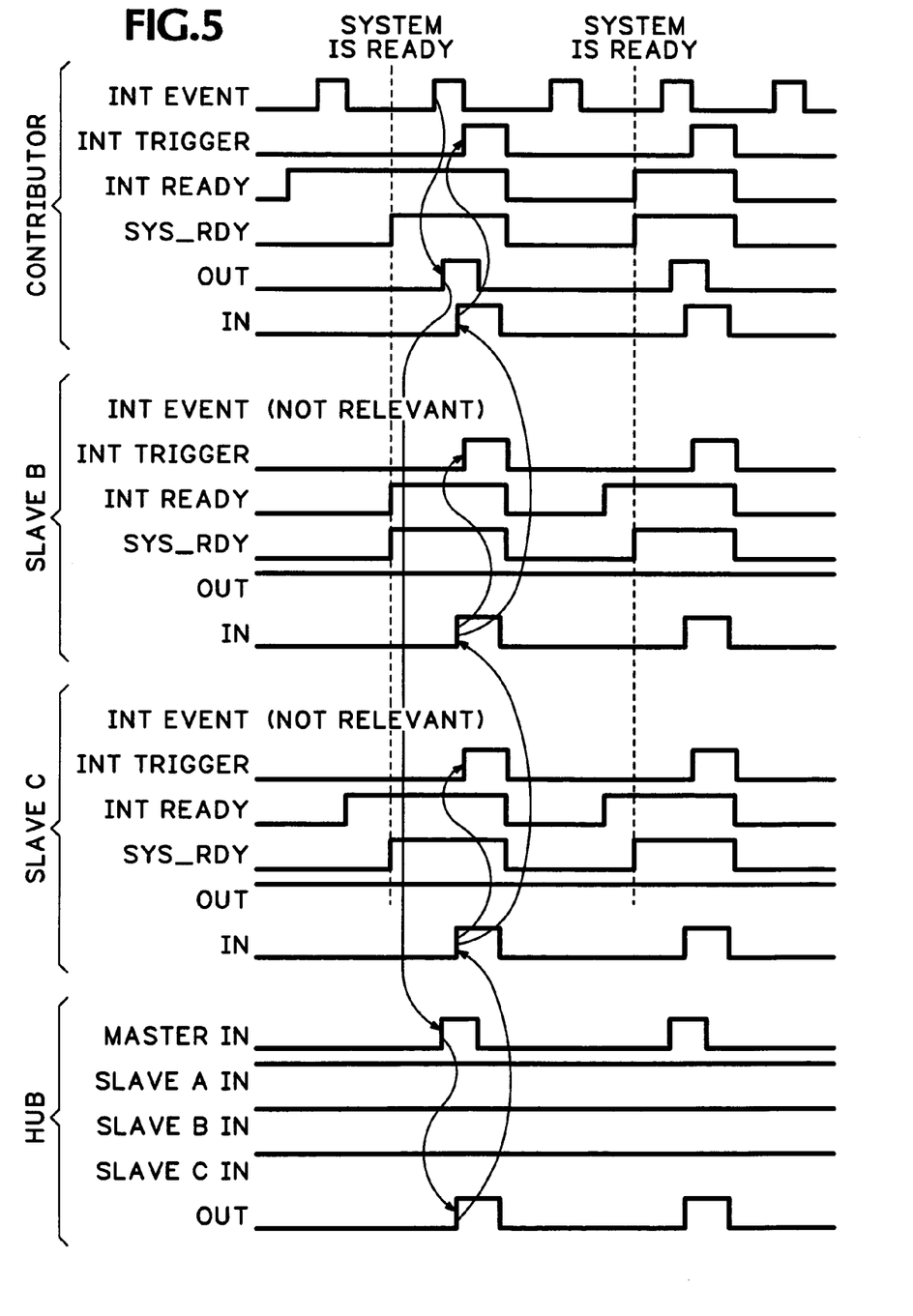
FIG. 5 is a partial timing diagram view for the configuration of FIG. 4 according to the present invention.

Referring to the timing diagram of FIG. 5, when the internal ready signals from all the instruments occurs, the system ready signal occurs. On the next master instrument internal event a gated event is transmitted via the event output and the hub 40 to the event inputs of all the instruments. In response to the gated event from the master instrument 34 all of the instruments produce internal triggers in synchronization.

Figure 6:
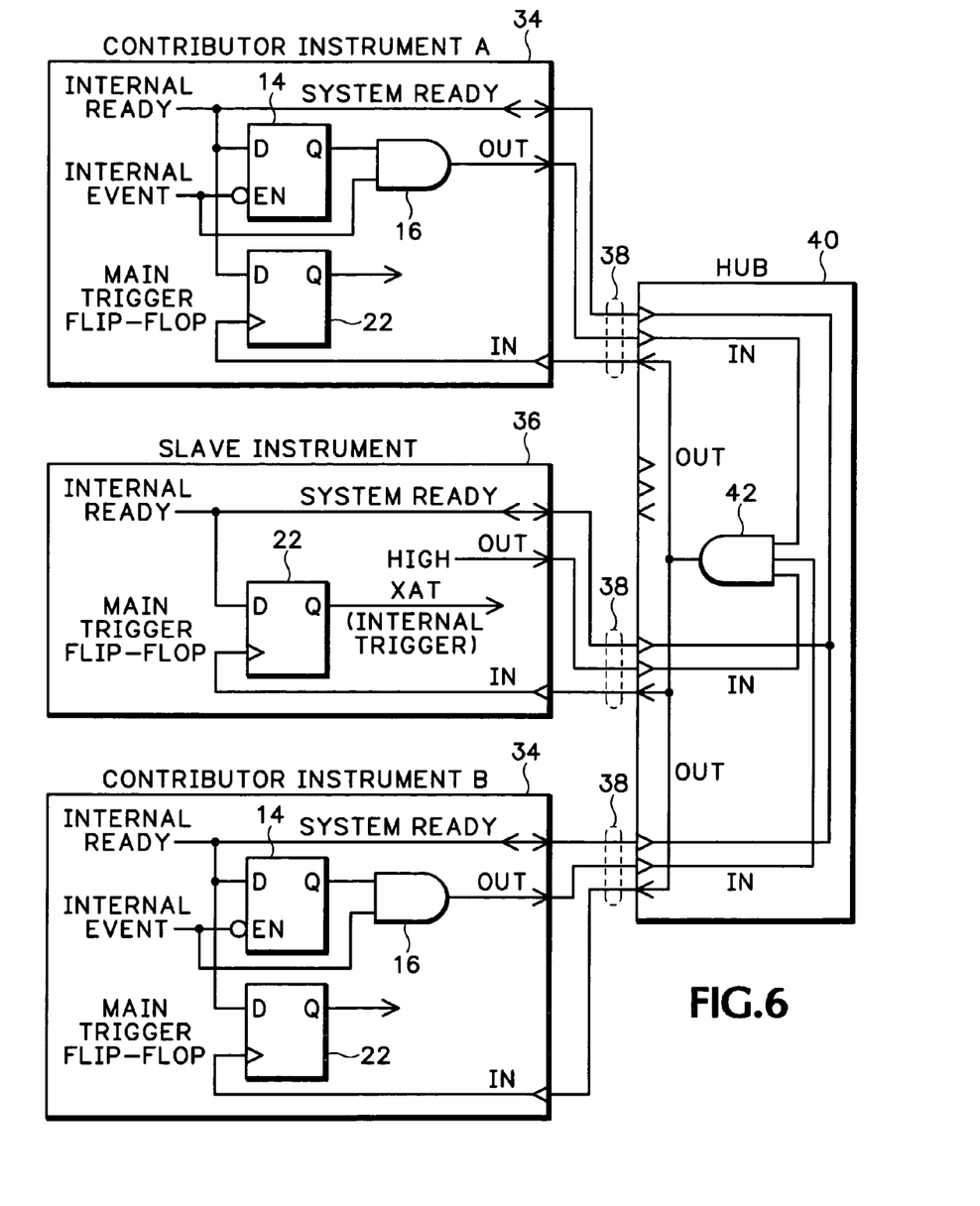
FIG. 6 is a simple schematic diagram view for coordinating trigger events between contributing instruments according to the present invention.
Figure 7:
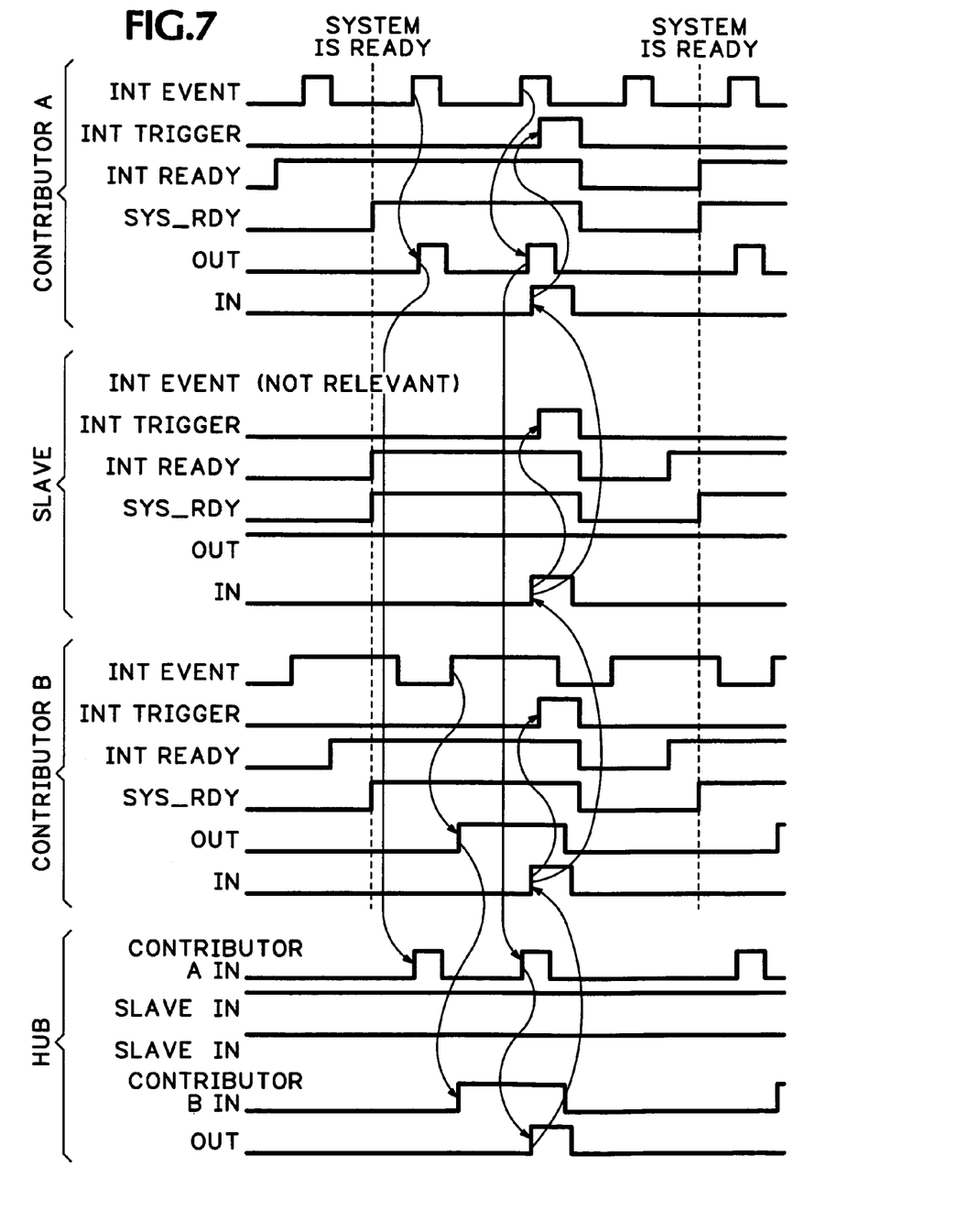
FIG. 7 is a timing diagram view for the configuration of FIG. 6 according to the present invention.

FIG. 6 shows a configuration where there are multiple contributor and multiple slave instruments 34, 36 (only one slave instrument being shown explicitly). The contributor instruments 34 are setup as shown previously, as is the slave instrument 36. The hub 40 is set up to include all of the connected instruments in an AND function 42 that is used to generate the trigger. When all instruments 34, 36 are ready to accept triggers as indicated by the internal ready signals, the system ready signal goes high and enables all the main trigger flip-flops 22 and the ready latches 14 in the contributor instruments. When the contributor instruments 34 generate overlapping gated internal events, they are combined with HIGH outputs from the slave instruments using the AND function 42 in the hub 40 to generate the coordinated trigger event for all of the instruments. Generating the trigger event in the hub 40 and using equal length multi-instrument trigger cables 38 reduces the minimum time required for overlapping trigger events to generate a trigger for all instruments 34, 36. Also it eliminates the possibility that one instrument triggers without the other instruments triggering. Finally it minimizes the time misalignment between the trigger events in the instruments. Any residual misalignment may be removed with the manual skew controls. FIG. 7 shows the timing for the configuration of FIG. 6.

Figure 8:
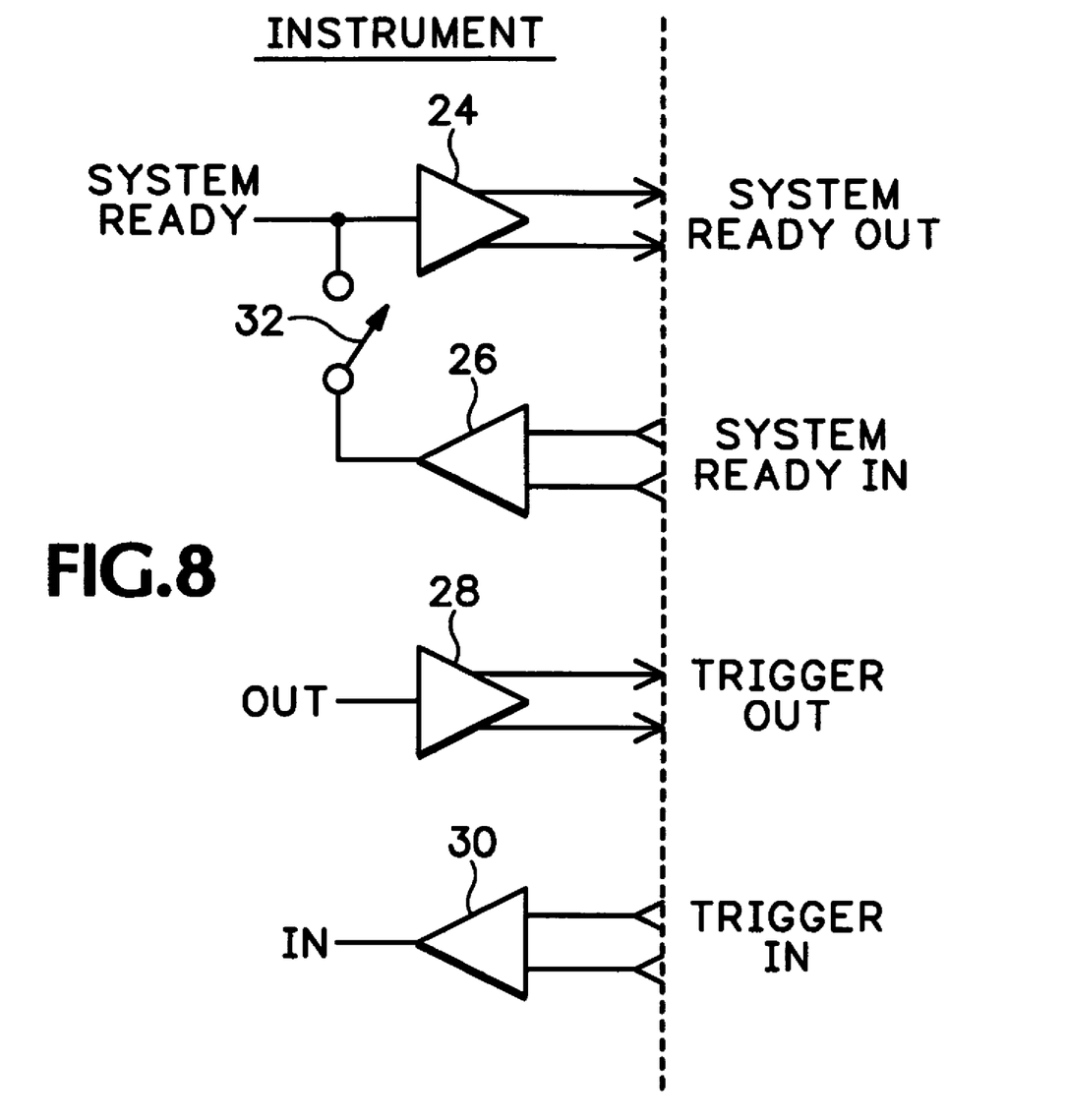
FIG. 8 is a simple schematic diagram view for differential signals to and from the trigger generator of FIG. 1 according to the present invention.

The above discussed configurations use an open-drain wire-OR line with pull-ups in every instrument for the system ready line. However for long multi-instrument trigger cables 38, differential communication between instruments is desired. Therefore, the system ready function may be split into two signals: SYS_RDY_IN and SYS_RDY_OUT, and appropriate single-ended to differential or differential to single-ended amplifiers 24–30 may be inserted on the instrument side of the respective ports, as shown in FIG. 8. This provides a differential external output (SYS_RDY_OUT), a differential external input (SYS_RDY_IN), a differential event output and a differential event input. A switch 32 ties the output of the SYS_RDY_IN amplifier 26 to the input of the SYS_RDY_OUT amplifier 24 when a wire-OR'd system ready is desired for a particular instrument. Two instruments are connected with crossed-over differential pair wires, but the SYS_RDY_IN is not normally connected to the SYS_RDY_OUT.

Figure 9:
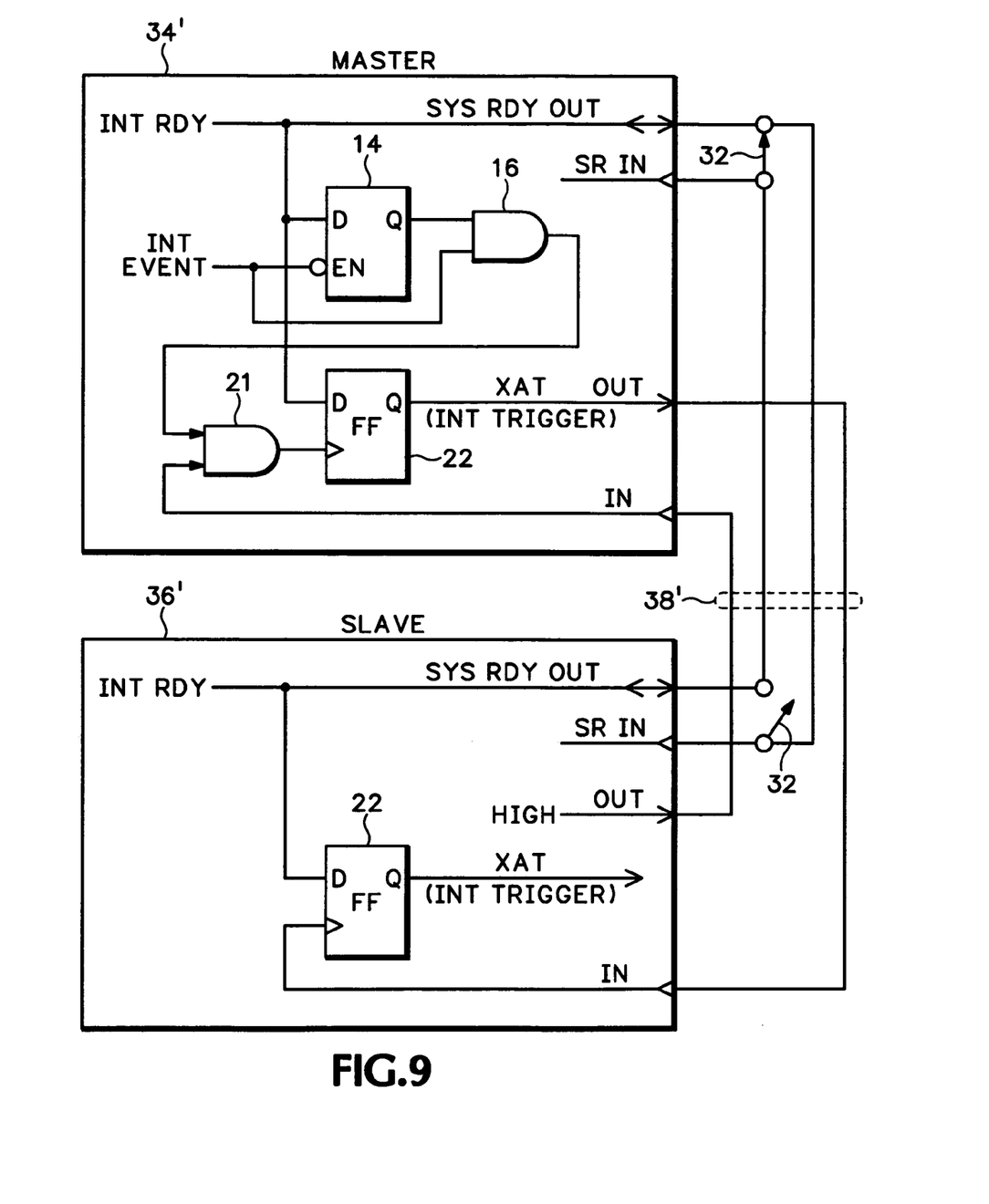
FIG. 9 is a simple schematic diagram view for coordinating trigger events between contributing and slave instruments according to the present invention.

As shown in FIG. 9 a simple two instrument master/slave triggering configuration has a master instrument 34' set up so the event output is programmed to send the internal trigger over the multi-instrument trigger cable 38' to the event input of a slave instrument 36'. The master instrument 34' also is programmed to combine the event input with the gated event to produce a combinational event for the main trigger flip-flop 22. This is slightly different than the master setup shown in FIG. 2. The change is not required in this example, but is made to allow a master instrument setup that is consistent with the example shown in FIG. 10. The slave instrument 36' is programmed to have the logic HIGH on the event output and to use the trigger received at the event input as a raw trigger event. The internal switches 32 (shown externally for illustration) are configured to be connected at the master instrument 34'. The operation of this configuration is the same as that of FIG. 2, as shown by the timing diagram of FIG. 3 with the exception that the event input at the master instrument 34' is HIGH to enable the gated trigger AND gate 21.

Figure 10:
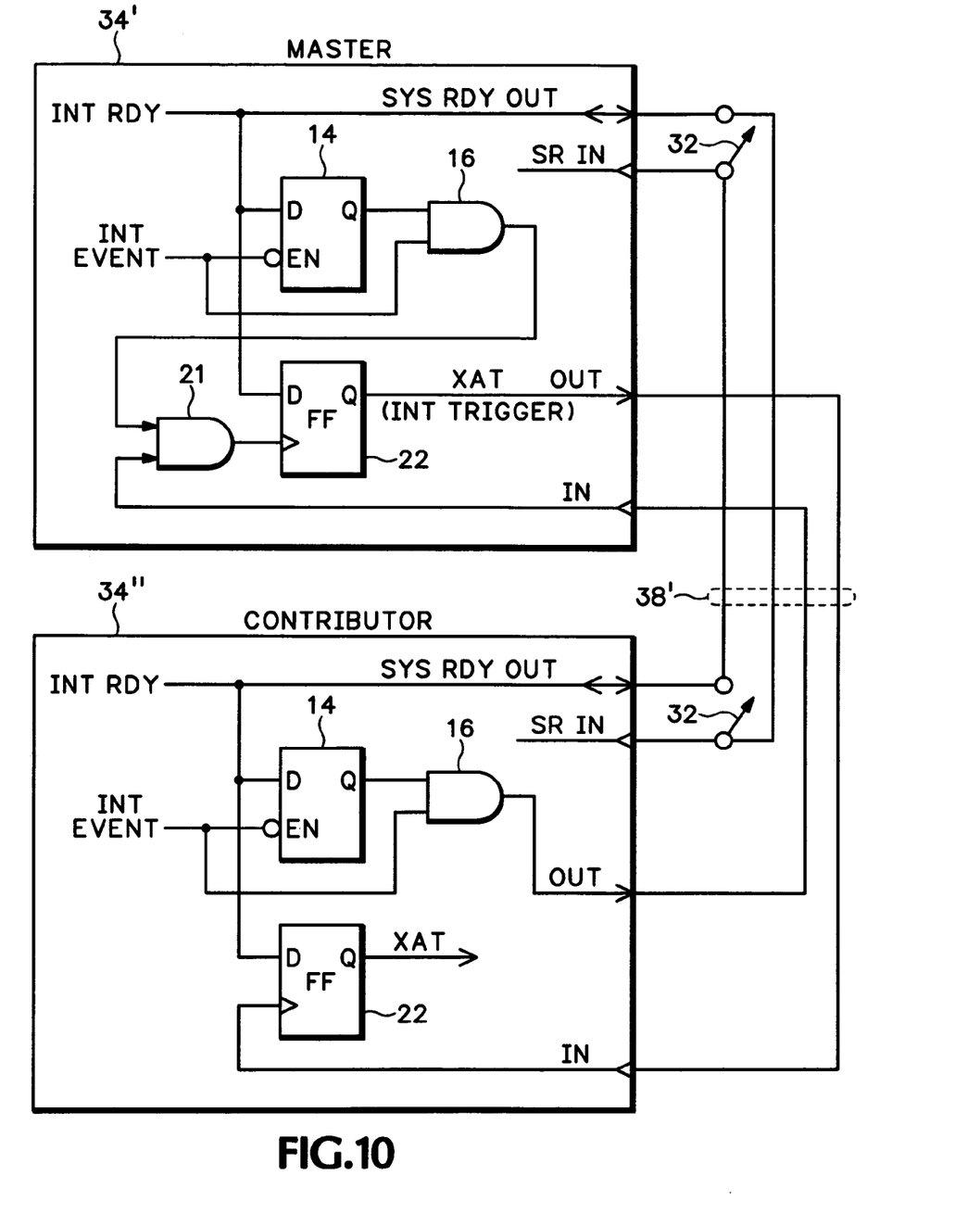
FIG. 10 is a simple schematic diagram view for coordinating trigger events between contributing instruments differentially according to the present invention.
Figure 11:
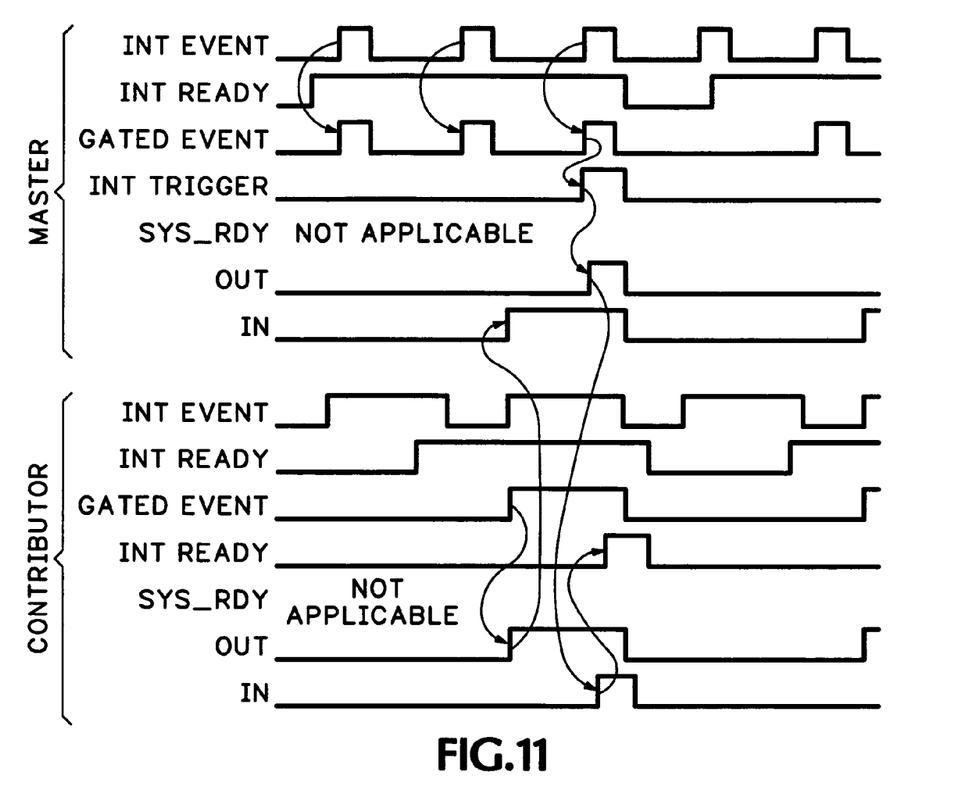
FIG. 11 is a timing diagram view for the configuration of FIG. 10 according to the present invention.

A two-instrument multiple contributor triggering configuration is shown in FIG. 10. The master instrument 34' is set up as the usual master instrument, as shown in FIG. 9. The contributor instrument 34" is set up as a contributor such that the event output is programmed to send internal gated trigger events when the contributor instrument is ready. The SYS_RDY ports are not interconnected by opening the switches 32, i.e., the instruments operate on their own internal ready signals. When the master instrument 34' is ready to accept triggers, the internal ready signal is input to the main trigger flip-flop 22 and the ready latch 14. This allows gated events to reach the gated trigger AND gate 21. When the contributor instrument 34" is ready to accept triggers, the internal ready signal enables the main trigger flip-flop 22 and the ready latch 14. The master instrument 34' generates internal events that are passed through the output AND gate 16 to the gated trigger AND gate 21. The contributor instrument 34" generates internal events that are passed through the output AND gate 16 to its gated trigger AND gate 21. When internal trigger events reach the master instrument gated trigger AND gate 21 from the contributor instrument 34" via its event output and the event input of the master instrument 34' and the two internal events overlap, the master instrument produces an internal trigger event which in turn triggers the contributor instrument so that the two instruments are synchronized. Essentially the instruments are made system ready when both instruments have internal ready signals. See FIG. 11 for the corresponding timing diagram.

Figure 12:
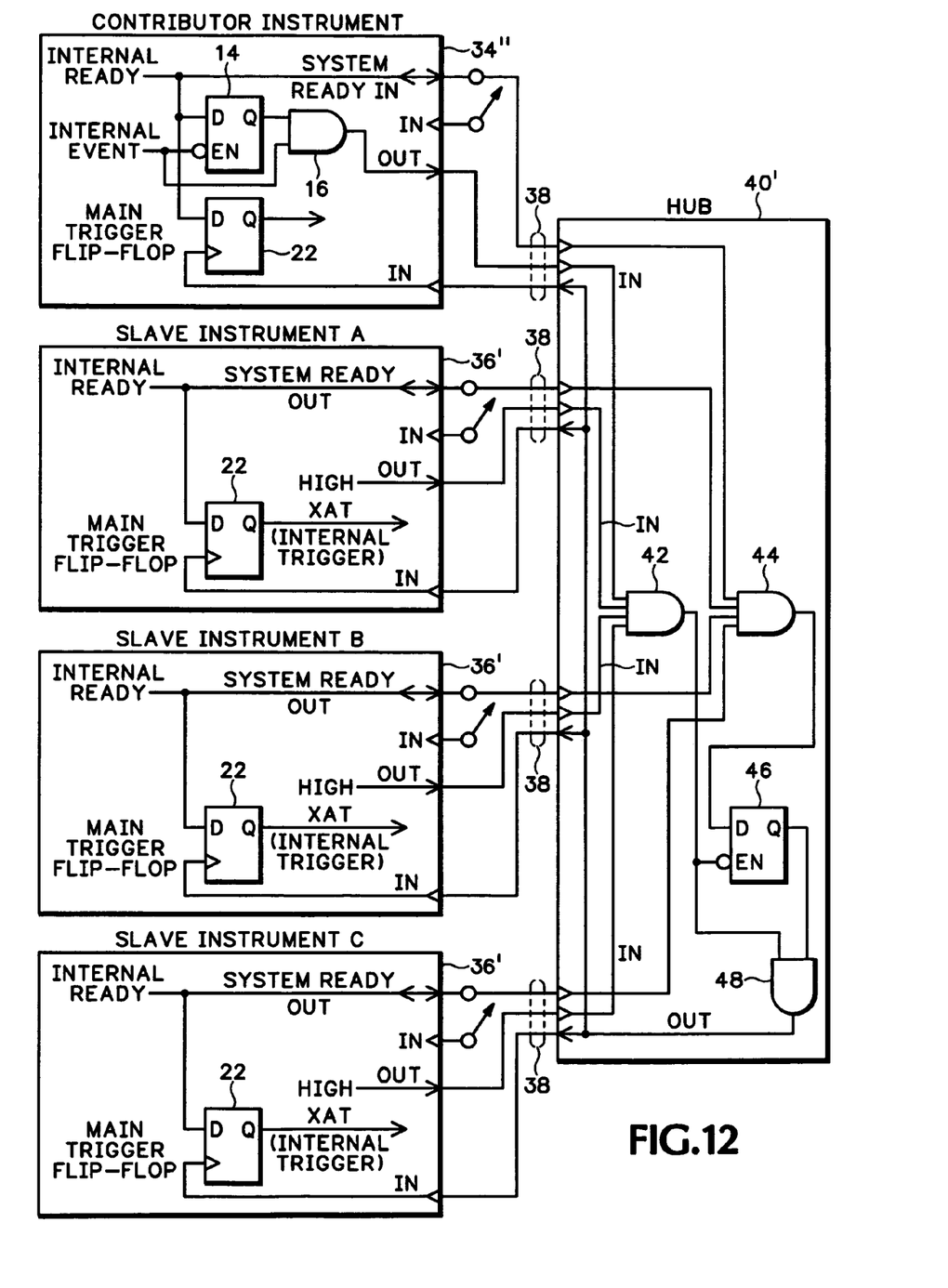
FIG. 12 is a simple schematic diagram view for coordinating a master and multiple slave instruments corresponding to FIG. 4 according to the present invention.

For a multiple instrument master/slave triggering configuration the hub 40' is modified, as shown in FIG. 12. The master instrument 34" is setup as a contributor as in FIG. 10. The internal ready signals from all instruments are input to a hub ready AND gate 44 in the hub 40', the output of which enables a hub ready latch 46. The output of the hub AND gate 42 is used to enable the hub ready latch 46, and also is input to an output AND gate 48 together with the output of the hub ready latch. The slave instruments 36' all have a HIGH output on their event outputs to remove them from the trigger decision process. When all internal ready signals occur, indicating all instruments are ready to receive a trigger, then the hub output AND gate 48 is enabled by the hub ready latch 46 so that the next internal event from the contributor instrument 34" via its ready AND gate 16 and the hub AND gate 42 generates a gated trigger event from the hub output AND gate 48 that is applied back to all of the event inputs of the instruments to synchronize the internal triggers for all instruments.

Figure 13:
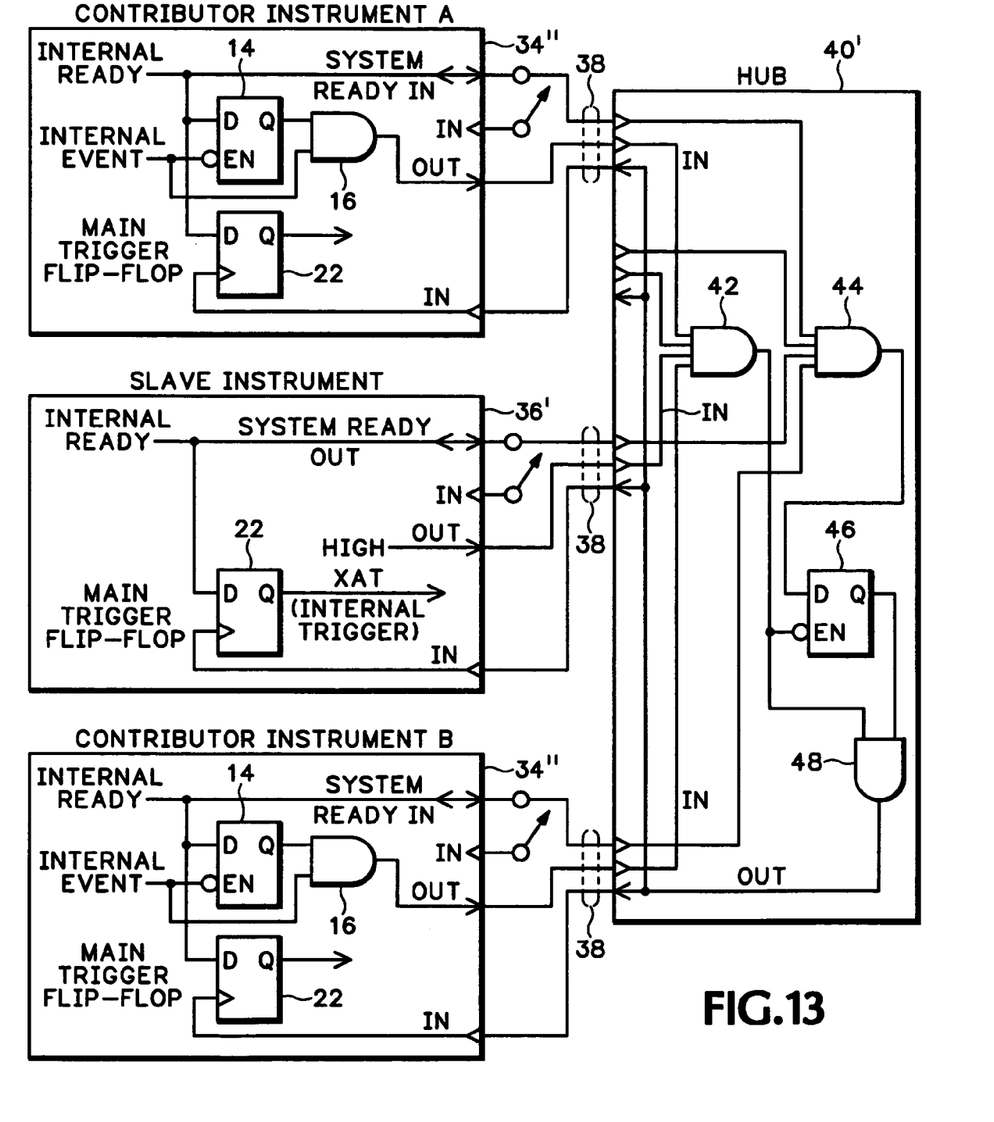
FIG. 13 is a simple schematic diagram view for coordinating multiple master and slave instruments corresponding to FIG. 6 according to the present invention.

For a mixed instrument environment, such as shown in FIG. 13 where there are two or more contributor instruments 34" and possibly a number of slave instruments 36' (one of which is shown for illustration), all the contributor instruments are set up as the contributor instrument in FIG. 10, and the slave instruments are set up as shown in FIG. 9. The hub 40' is used to generate the coordinated trigger event. When all instruments are ready to accept triggers, any overlapping trigger events between the contributor instruments 34" generates the coordinated trigger from the hub 40' which is provided to all event inputs to trigger all instruments in a synchronous manner.

Thus the present invention provides a multi-instrument triggering mechanism by adding a system ready line in an instrument's trigger system that may be coupled via an external output port to the system ready lines of other instruments so that all instruments trigger from a coordinated trigger signal.

What is claimed is:

1. An improved trigger system suitable for multi-instrument synchronized triggering of the type having means for generating, when enabled by a trigger ready signal, a trigger signal in response to a trigger event, wherein the improvement comprises a system ready line for coupling an internal trigger ready signal to an external port such that, when the external port is coupled to like external ports of other instruments and the internal trigger ready signals for all the coupled instruments are asserted, the trigger ready signal is asserted via the system ready line to enable the generating means.

2. The improved trigger system as recited in claim 1 further comprising means for generating a gated trigger event from the trigger ready signal and an internal trigger event.

3. The improved trigger system as recited in claim 2 further comprising means for selecting one of the group consisting of a logic HIGH signal, the gated trigger event and the trigger signal for coupling to a trigger event output port to provide an output trigger event.

4. The improved trigger system as recited in claim 2 further comprising means for selecting one of the group consisting of an external trigger event received at a trigger input port, the gated trigger event, and a combination of the external trigger event and the gated trigger event for coupling as the trigger event to the generating means.

5. The improved trigger system as recited in claim 2 wherein the gated trigger event generating means comprises:
a ready latch having the trigger ready signal as an input, an inverted version of the internal trigger event as an enable input, and a ready signal as an output; and
means for combining the internal trigger event and the ready signal to produce the gated trigger event.

6. A multi-instrument triggering system comprising:
a first instrument having a first trigger system for generating, when enabled by a trigger ready signal, a first trigger signal in response to a trigger event, the first trigger system having a system ready port coupled to receive an internal trigger ready signal, a trigger event output port to provide an output trigger event and a trigger event input port to receive an external trigger event;
a second instrument having a second trigger system for generating, when enabled by a trigger ready signal, a second trigger signal in response to a trigger event, the second trigger system having a system ready port coupled to receive an internal trigger ready signal, a trigger event output port to provide an output trigger event and a trigger event input port to receive an external trigger event; and
a trigger bus cable for coupling the system ready ports together such that, when both internal trigger ready signals are asserted together, the trigger ready signal is asserted to enable the first and second trigger systems, and for cross-coupling the trigger event output port of one instrument to the trigger event input port of the other instrument so that the output trigger event from the one instrument is the external trigger event for the other instrument;
whereby the first and second trigger signals occur in synchronism.

7. The multi-instrument triggering system as recited in claim 6 wherein the first instrument comprises a master instrument and the second instrument comprises a slave instrument such that, when coupled together by the trigger bus cable, the output trigger event from the master instrument provides the first trigger signal as the external trigger event for the slave instrument to generate the second trigger signal in synchronism with the first trigger signal.

8. A multi-instrument triggering system comprising:
a plurality of instruments, each having a trigger system for generating, when enabled by a trigger ready signal, an internal trigger signal in response to a trigger event, and each trigger system having a system ready port coupled to receive an internal trigger ready signal, having an output trigger event port to provide an output trigger event and having an input trigger event port to receive an external trigger event;
a hub coupled to the output trigger event ports, the input trigger event ports and the system ready ports for combining the system ready ports together such that, when all instruments assert their internal trigger ready signals together, the trigger ready signal is asserted to enable all trigger systems, for combining the output trigger event ports together to produce the external trigger event from the output trigger events, and for applying the external trigger event to all input trigger event ports as the trigger event for generating the internal trigger signals for all instruments in synchronism.

9. The multi-instrument triggering system as recited in claim 8 wherein the system ready ports are combined via an open-drain-type wire-OR configuration such that only when all instruments assert the internal trigger ready signals are the system ready ports pulled high to assert the trigger ready signal.

10. A method of coordinating trigger events between a plurality of instruments comprising:
connecting an internal trigger ready signal from each of the instruments together in such a way that only when all of the internal trigger ready signals are asserted is a trigger ready signal asserted for all of the instruments;
generating a trigger event for all instruments enabled by the trigger ready signal when an internal trigger event from at least one of the instruments occurs; and
generating trigger signals for all instruments in synchronism in response to the trigger event.

11. The method as recited in claim 10 further comprising the steps of:
combining at a hub the internal ready signals from the instruments as part of the connecting step to assert the trigger ready signal; and
combining at the hub trigger event signals output from the instruments to produce the trigger event in the trigger event generating step.

12. A trigger system suitable for multi-instrument synchronized triggering comprising:
a system ready line for coupling an internal ready signal to a trigger ready port;
a ready latch having an input coupled to the system ready line, having an enable input coupled to receive an inverted version of an internal trigger event, and having an output to provide a ready signal;
a ready AND gate having the ready signal and the internal trigger event as inputs and a gated trigger event as an output;
a trigger flip-flop having an input coupled to the system ready line, a clock input coupled to receive a trigger event, and an output to provide an internal trigger;
means for coupling one of the gated trigger event, a logic HIGH and the internal trigger to a trigger event output port; and
means for coupling one of the gated trigger event, an external trigger event via a trigger event input port and a combination of the gated trigger event and the external trigger event as the trigger event.

* * * * *